United States Patent
Pan et al.

(10) Patent No.: US 6,661,037 B2
(45) Date of Patent: Dec. 9, 2003

(54) LOW EMITTER RESISTANCE CONTACTS TO GAAS HIGH SPEED HBT

(75) Inventors: Noren Pan, Wilmette, IL (US); Byung-Kwon Han, Evanston, IL (US)

(73) Assignee: MicroLink Devices, Inc., Niles, IL (US)

( * ) Notice: Subject to any disclaimer, the term of this patent is extended or adjusted under 35 U.S.C. 154(b) by 0 days.

(21) Appl. No.: 10/200,892

(22) Filed: Jul. 22, 2002

(65) Prior Publication Data

US 2003/0025128 A1 Feb. 6, 2003

Related U.S. Application Data

(60) Provisional application No. 60/306,833, filed on Jul. 20, 2001.

(51) Int. Cl.$^7$ ............... H01L 31/0328; H01L 31/0336; H01L 31/072; H01L 31/109
(52) U.S. Cl. ............... 257/197; 257/187; 257/198; 438/312; 438/317
(58) Field of Search ............... 257/187, 197, 257/198; 438/312, 317, 320

(56) References Cited

U.S. PATENT DOCUMENTS 6,043,520 A * 3/2000 Yamamoto et al. ......... 257/198

2002/0190273 A1 * 12/2002 Delage et al. ............... 257/197

OTHER PUBLICATIONS

Oka, T. et al. "Low turn-on voltage GaAs heterojunction bipolar transistors with a pseudomorphic GaAsSb base" *Applied Physics Letters*. Jan. 22, 2001; 78(4):483–485.

Sullivan, G.J. et al. "High Gain AlInAs/GaAsSb/AlInAs NpN HBTs on Inp" *Journal of Electronic Materials*. 1992; 21(12):1123–1125.

Yan, B.P. et al. "InGaP/GaAsSb/GaAs DHBTs with Low Turn–on Voltage and High Current Gain" *14th Indium Phosphide and Related Materials Conference (IPRM'02)*, May 12–16, 2002, Stockholm, Sweden, pp. 169–172.

* cited by examiner

*Primary Examiner*—Ngân V. Ngô
(74) *Attorney, Agent, or Firm*—Lahive & Cockfield, LLP

(57) ABSTRACT

A heterojunction bipolar transistor is provided having an improved current gain cutoff frequency. The heterojunction bipolar transistor includes a contact region formed from InGaAsSb. The contact region allows an emitter region of the heterojunction bipolar transistor to realize a lower contact resistance value to yield an improved cutoff frequency ($f_T$).

45 Claims, 3 Drawing Sheets

Low Emitter resistance Contacts to InP High Speed HBT

Figure 2    Low Emitter resistance Contacts to InP High Speed HBT

LOW EMITTER RESISTANCE CONTACTS TO GAAS HIGH SPEED HBT

RELATED APPLICATIONS

This application claims priority to U.S. provisional application Serial No. 60/306,833, filed on Jul. 20, 2001, and entitled Low Emitter Resistance Contacts to InP High Speed HBT.

BACKGROUND OF THE INVENTION

This invention relates generally to semiconductor transistors. In particular, the invention relates to heterojunction bipolar transistors. Heterojunction bipolar transistors (HBTs) offer much higher speed of operation than the more prevalent metal-oxide-semiconductor field-effect transistors (MOSFETs) or even conventional homojunction bipolar transistors, e.g., pnp or npn silicon transistors. Because HBTs offer high speed, a high current driving capability, and a low 1/f noise levels, HBTs are becoming popular for use as integrated switching devices and microwave devices in wireless communications systems and sub-systems, satellite broadcast systems, automobile collision avoidance systems, global positioning systems, and other high-frequency applications. One application in which HBT use continues to increase is in the design and manufacture of wireless electronic devices, such as wireless telephones and other like electronic devices that are capable of communicating with a network in a wireless manner. Although HBT's offer many benefits over bipolar silicon transistors, there remains a need to improve or extend the frequency response of HBT's.

SUMMARY OF THE INVENTION

The present invention provides an GaAs based HBT having an increased or extended frequency response. The GaAs based HBT provides an improved frequency response by reducing an emitter resistance value of the HBT.

In one embodiment of the present invention, a heterojunction bipolar transistor is provided that includes a substrate, a collector portion having at least one layer of a first material disposed on the substrate to form a first stack, a base portion having at least one layer of a second material disposed on a portion of the collector portion to form a second stack. The HBT further includes an emitter portion having at least one layer of the first material disposed over a portion of the base portion to form a third stack and a contact portion having at least one layer of the first material and at least one layer of an $In_xGa_{1-x}(As_{1-y}Sb_y)$ (0<x<0.7) (0<y<0.5) material disposed over a portion of the emitter portion to form a fourth stack. The $In_xGa_{1-x}(As_{1-y}Sb_y)$ (0<x<0.7) (0<y<0.5) material of the contact portion and the first material of the contact portion provide a minimal conduction band offset in the contact region of the HBT, when compared to other material types. As such, a conduction band discontinuity between in the contact region is minimized to improve the flow of electrons between the contact region and the emitter region, and, as such, realizes a reduction in the resistance value of the emitter region. The reduced resistance value of the emitter significantly increases the frequency response of the HBT. As such, the current gain cutoff frequency ($f_T$) of the HBT is improved above 200 GHz.

In another embodiment of the present invention, a heterojunction bipolar transistor is provided that includes a substrate, a collector portion having at least one layer of a first material disposed on the substrate to form a first stack, a base portion having at least one layer of a second material disposed on a portion of the collector portion to form a second stack. The HBT further includes an emitter portion having at least one layer of a third material disposed over a portion of the base portion to form a third stack and a contact portion having at least one layer of the first material and at least one layer of an $In_xGa_{1-x}(As_{1-y}Sb_y)$ (0<x<0.7) (0<y<0.5) material disposed over a portion of the emitter portion to form a fourth stack. The $In_xGa_{1-x}(As_{1-y}Sb_y)$ (0<x<0.7) (0<y<0.5) of the contact portion and the first material of the contact portion provide a minimal conduction band offset in the contact region of the HBT, when compared to other material types. As such, a conduction band discontinuity in the contact region is minimized to improve the flow of electrons between the emitter region and the contact region, and as such, reduce the resistance value of the emitter region. The reduced resistance value realized by the emitter significantly increases the frequency response of the HBT. As such, the current gain cutoff frequency ($f_T$) of the HBT is improved above 100 GHz.

In still another embodiment of the present invention a method for forming a compound semiconductor device having an extended frequency response is provided. The method includes steps for forming a collector stack having at least one layer of a first material on a substrate and forming a base stack having at least one layer of a second material on a portion of the collector stack. The method further provides the steps for forming an emitter stack having at least one layer of the first material on a portion of the base stack, and forming a contact stack having at least one layer of the first material and at least one layer of an $In_xGa_{1-x}(As_{1-y}Sb_y)$ (0<x<0.7) (0<y<0.5) material on a portion of the emitter stack. The forming of the contact stack of the $In_xGa_{1-x}(As_{1-y}Sb_y)$ (0<x<0.7) (0<y<0.5) material and first material allows the fabricated compound semiconductor device to realize a significant reduction in emitter resistance due to a minimal conduction band offset value in the contact stack. The resulting compound semiconductor device realizes an improved or extended $f_T$ of about 100 GHz.

In yet another embodiment of the present invention a method for forming a compound semiconductor device having an extended frequency response is provided. The method includes steps for forming a collector stack having at least one layer of a first material on a substrate and forming a base stack having at least one layer of a second material on a portion of the collector stack. The method further provides the steps for forming an emitter stack having at least one layer of a third material on a portion of the base stack, and forming a contact stack having at least one layer of the first material and at least one layer of an $In_xGa_{1-x}(As_{1-y}Sb_y)$ (0<x<0.7) (0<y<0.5) material on a portion of the emitter stack. The forming of the contact stack of the $In_xGa_{1-x}(As_{1-y}Sb_y)$ (0<x<0.7) (0<y<0.5) material and the first material allows the fabricated compound semiconductor device to realize a significant reduction in emitter resistance due to a minimal conduction band offset value in the contact stack. The resulting compound semiconductor device realizes an improved or extended $f_T$ greater than 100 GHz.

BRIEF DESCRIPTION OF THE DRAWINGS

The foregoing and other objects, features and advantages of the invention will be apparent from the following description, and from the accompanying drawings, in which like reference characters refer to the same parts throughout the different views. The drawings illustrate principles of the invention and are not to scale.

DETAILED DESCRIPTION OF THE INVENTION

The compound semiconductor of the present invention employs a contact region in communication with an emitter region to allow the compound semiconductor device to realize an improved or extended frequency response. The $f_T$ realized by the compound semiconductor device extends or improves the frequency response of the device to about 100 G Hz. The improved cutoff frequency of the compound semiconductor is particularly suitable for applications where the compound semiconductor device operates as part of a clock data recovery circuit, as a multiplexer circuit or part of a multiplexer circuit, as a transimpedance amplifier, or as a laser driver. Specifically, each of the illustrative embodiments described below are directed to GaAs based HBT device for use in portable or mobile electronic devices, such as cellular telephones, laptop computers with wireless modems and other like portable consumer devices, or other wireless communication devices and systems, such as satellite systems, terrestrial based systems, or a hybrid of terrestrial and satellite based systems. The compound semiconductor device of the present invention is configurable to suit a selected application as illustrated in the exemplary embodiments described in more detail below.

The compound semiconductor device of the present invention provides a range of significant benefits to engineers that design electronic devices capable of communicating with a network in a wireless manner. The compound semiconductor device of the present invention can extend or increase the cutoff frequency of the electronic device that communicates with a network in a wireless manner to provide the device or network with an improved bandwidth. The compound semiconductor device of the present invention is able to improve or extend the $f_T$ of an GaAs HBT to greater than 100 GHz. In this manner, the GaAs HBT of the present invention is well suited for applications that benefit from a device with a high switching speed, for example a multiplexer, a clock and data recovery circuit, or other like high speed operation.

Figure 1:
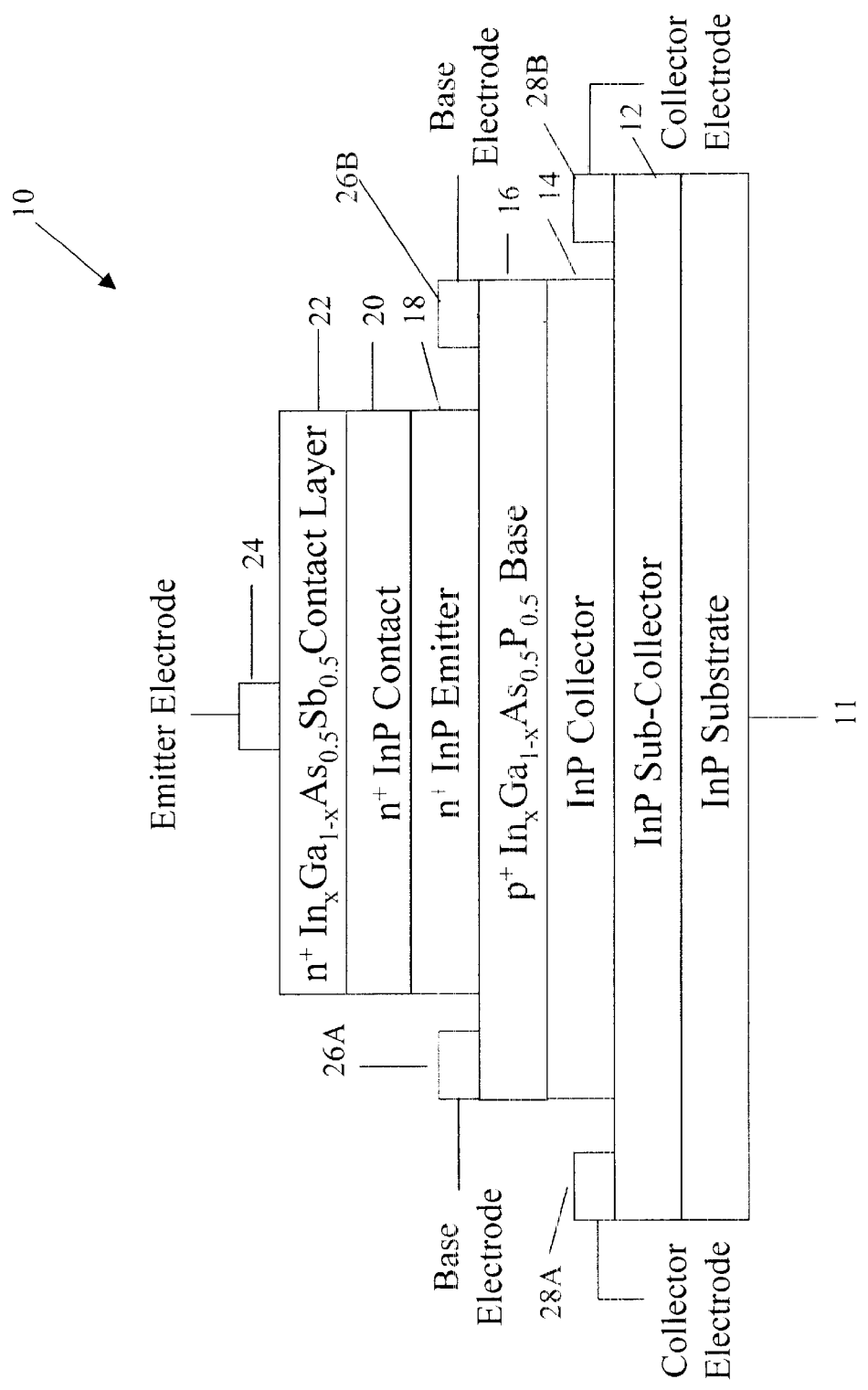
FIG. 1 is a cross-sectional view of a heterojunction bipolar transistor according to a first illustrative embodiment of the present invention.

FIG. 1 illustrates a cross-sectional view of an HBT according to a first illustrative embodiment of the present invention. The HBT 10 includes a collector region, a base region, an emitter region, and a contact region. The collector region of the HBT 10 includes a sub-collector layer 12 formed over a portion of a substrate 11 and a collector layer 14 formed over a portion of the sub-collector layer 12. The base region of the HBT 10 includes a base layer 16. In similar fashion, the emitter region of the HBT 10 includes an emitter layer 18. In like manner, the contact region of the HBT 10 includes a contact 20, and a contact layer 22. The HBT 10 further includes an emitter electrode 24 formed over a portion of the contact layer 22, base electrodes 26A and 26B formed over portions of the base layer 16, and collector electrodes 28A and 28B formed over portions of the sub-collector layer 12.

In more detail, the sub-collector layer 12 is a GaAs material formed over an GaAs substrate 11 and has a thickness of about 500 nm with an n-type impurity concentration of about $4\times10^{18}$ cm$^{-3}$. The thickness of the sub-collector layer 12 can be incrementally changed in 1 nm increments in a range from between about 500 nm and about 1,500 nm to reach a desired value. The collector layer 14 is formed over a portion of the sub-collector layer 12. The formed GaAs material of the collector layer 14 has a thickness of about 300 nm and is doped to have an n-type impurity concentration of about $1\times10^{16}$ cm$^{-3}$. The collector layer 14 can have its thickness incrementally changed in 1 nm increments in a range from between about 100 nm and about 2000 nm to reach a desired thickness.

The base layer 16 is a GaAs material formed over a portion of the collector layer 14 and is formed to have a thickness of less than about 50 nm. The base layer 16 is doped with p$^+$ impurities to have a high impurity concentration of about $4\times10^{19}$ cm$^{-3}$. It is further desirable to form the base layer 16 to have a thickness of between about 20 nm and about 40 nm. The thickness of the base layer 16 can be incrementally changed in 1 nm increments across the range of thickness to reach a desired value. The impurity concentration in the base layer can range from $1\times10^{19}$ t0 $1\times10^{20}$ cm$^{-3}$.

The emitter layer 18 is formed of an Al$_x$Ga$_{1-x}$As (0<x<0.5) material over a portion of the base layer 16. The emitter layer 18 is doped with N$^+$ impurities in a concentration of about $3\times10^{17}$ cm$^{-3}$. The emitter layer 18 is formed to have a thickness of about 50 nm, but can have a thickness of between about 10 nm and about 200 nm. The thickness of the emitter layer 18 can be incrementally changed in 1 nm increments across the thickness range to reach a desired thickness value.

The contact 20 is an GaAs material doped with N type impurities in a high concentration of about $4\times10^{18}$ cm$^{-3}$. The contact 20 is formed to have a thickness of about 100 nm and is formed over a portion of the emitter layer 18. The thickness of the contact 20 can range from between about 50 nm to about 300 nm in 1 nm increments.

The contact layer 22, is formed from an In$_x$Ga$_{1-x}$(As$_{1-y}$Sb$_y$) (0<x<0.7) (0<y<0.5) material doped with N$^+$ type impurities in a high concentration in excess of $1\times10^{19}$ cm$^{-3}$. The contact layer 22 is formed to have a thickness of between about 30 nm and about 150 nm, and is formed over a portion of the contact 20. The thickness of the contact layer 22 can range from between about 30 nm and about 150 nm in increments of 1 nm.

The contact layer 22 formed from the material and the contact 20 formed of the GaAs material provides a significant reduction in an emitter resistance value. The minimal conduction band offset or discontinuity between the In$_x$Ga$_{1-x}$(As$_{1-y}$Sb$_y$) (0<x<0.7) (0<y<0.5) material and the GaAs material that form the contact portion of the HBT 10 allow the emitter portion of the HBT 10 to realize a significant reduction in an emitter resistance value. For example, the emitter of the HBT 10 realizes an emitter resistance value of between about 3 ohms and about 7 ohms (L=2×2 um$^2$). The contact portion of the HBT 10 can be doped with a variety of n-type dopants, for example, silicon, tellurium, sulfur, tin, or selenium to realize a lower emitter resistance. Moreover, the use of indium in the contact portion of the HBT 10 provides an increase in the electron mobility, which, in turn, provides a reduction in the resistance value associated with the emitter portion of the HBT 10. As such, the HBT 10 is well suited for use in or as a high speed multiplexer or in a high speed clock or data recovery circuit.

Figure 2:
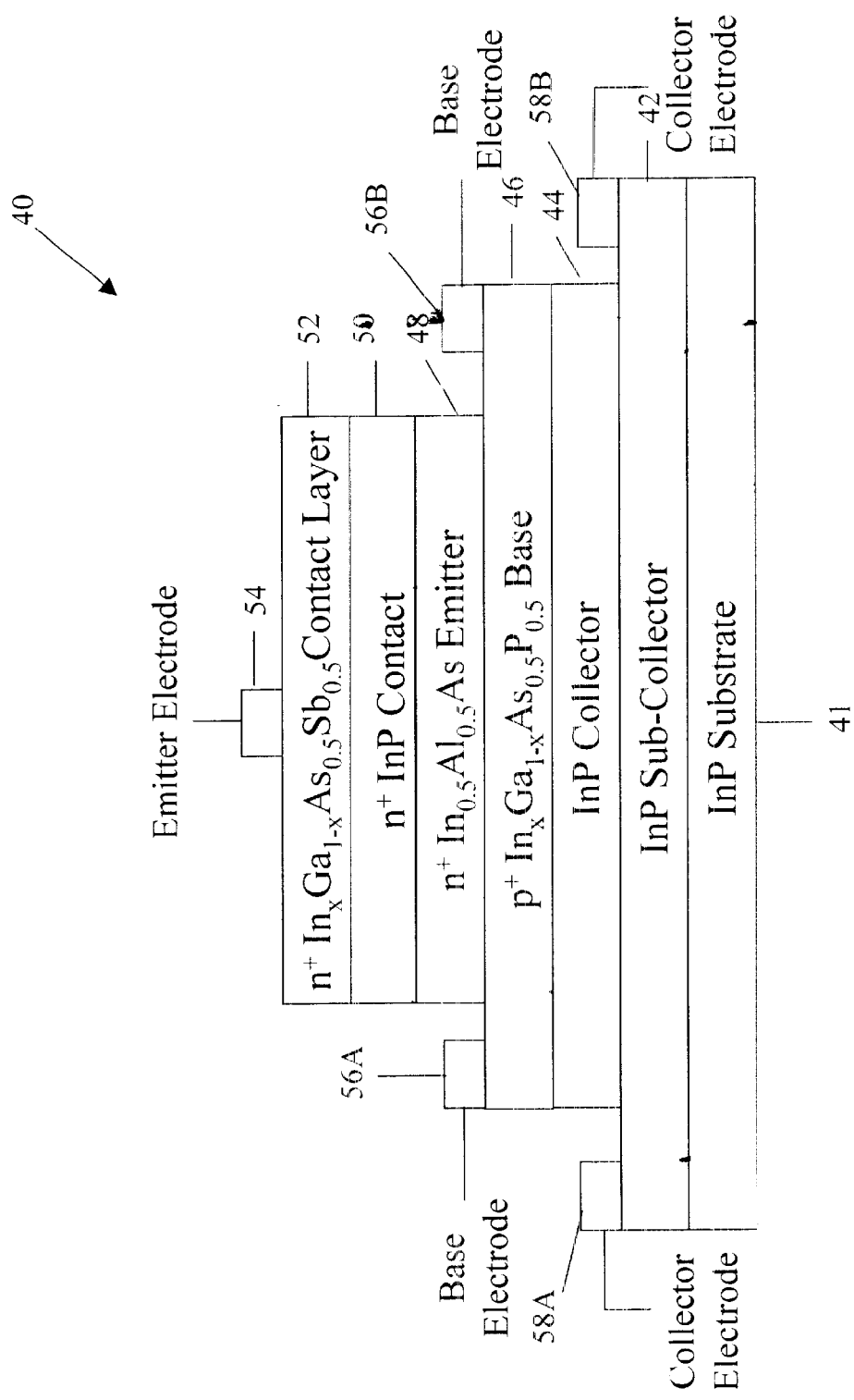
FIG. 2 is a cross-sectional view of a heterojunction bipolar transistor according to a second illustrative embodiment of the present invention.

FIG. 2 illustrates a cross-sectional view of an HBT 40 according to a second illustrative embodiment of the present invention. The HBT 40 includes a collector region, a base region, an emitter region, and a contact region. The collector region of the HBT 40 includes a sub-collector layer 42 formed over a portion of a substrate 41, and a collector layer 44 formed over a portion of the sub-collector layer 42. The base region of the HBT 40 includes a base layer 46. In similar fashion, the emitter region of the HBT 40 includes an emitter layer 48. In like manner, the contact region of the HBT 40 includes a contact 50, and a contact layer 52. The HBT 40 further includes an emitter electrode 54 formed over a portion of the contact layer 52, base electrodes 56A and 56B formed over portions of the base layer 46, and collector electrodes 58A and 58B formed over portions of the sub-collector layer 52.

In more detail, the substrate is an GaAs material. The sub-collector layer 52 is an InP material formed over the substrate 41 and has a thickness of about 500 nm with an n-type impurity concentration of about $4 \times 10^{18}$ cm$^{-3}$. The sub-collector layer 52 can have a thickness from between about 500 nm to about 1,500 nm. The thickness of the sub-collector layer 52 can be changed in increments of about 1 nm. The collector layer 44 is formed of an GaAs material over a portion of the sub-collector layer 52. The formed GaAs material of the collector layer 44 has a thickness of about 300 nm and is doped with an n-type impurity concentration of about $1 \times 10^{16}$ cm$^{-3}$. The collector layer 44 can have its thickness changed in 1 nm increments in a range from between about 100 nm to about 2,000 nm.

The base layer 46 is a p-type GaAs material formed over a portion of the collector layer 44, and is formed to have a thickness of less than about 40 nm. The base layer 46 is doped to have an acceptor impurity concentration of about $4 \times 10^{19}$ cm$^{-3}$. It is further desirable to form the base layer 46 to have a thickness of between about 20 nm and about 40 nm. The thickness of the base layer 46 can be changed in increments of 1 nm. The impurity concentration in the base layer can range from $1 \times 10^{19}$ to $1 \times 10^{20}$ cm$^{-3}$.

The emitter layer 48 is formed of an $In_{0.51}Ga_{0.49}P$ material over a portion of the base layer 46. The emitter layer 48 is doped with N type impurities in a concentration of about $3 \times 10^{17}$ cm$^{-3}$. The emitter layer 48 is formed to have a thickness of between about 50 nm to about 300 nm in 1 nm increments. It is desirable to form the emitter layer 48 with a thickness of about 50 nm.

The contact 50 is an GaAs material doped with N$^+$ type impurities in a high concentration of about $4 \times 10^{18}$ cm$^{-3}$. The contact 50 is formed to have a thickness of between about 5 nm and about 300 nm in 1 nm increments, and is formed over a portion of the emitter layer 48. It is desirable to form the contact 50 to have a thickness of about 100 nm.

The contact layer 52, is formed from an $In_xGa_{1-x}(As_{1-y}Sb_y)$ (0<x<0.7) (0<y<0.5) material doped with N type impurities in a high concentration in excess of $1 \times 10^{19}$ cm$^{-3}$. The contact layer 52 is desirably formed to have a thickness of between about 30 nm and about 150 nm in 1 nm increments. The contact layer 52 is formed over a portion of the contact 50.

The contact layer 52 formed from the $In_xGa_{1-x}(As_{1-y}Sb_y)$ (0<x<0.7) (0<y<0.5)) material and the contact 50 formed of the InP material provides a significant reduction in an emitter resistance value. The minimal conduction band offset or discontinuity between the $In_xGa_{1-x}(As_{1-y}Sb_y)$ (0<x<0.7) (0<y<0.5) material and the InP material that form the contact portion of the HBT 40 allow the emitter portion of the HBT 40 to realize a significant reduction in an emitter resistance value. For example, the emitter of the HBT 40 realizes an emitter resistance value of about 3 ohms to about 7 ohms (L=2×2 um$^2$). The contact portion of the HBT 40 can be doped with a variety of n-type dopants, for example, silicon, tellurium, sulfur, tin, or selenium Moreover, the use of indium in the contact portion of the HBT 40 provides an increase in the electron mobility, which, in turn, provides a reduction in the resistance value associated with the emitter portion of the HBT 40. As such, the HBT 40 is well suited for use in or as a high speed multiplexer or in a high speed clock or data recovery circuit.

Figure 3:
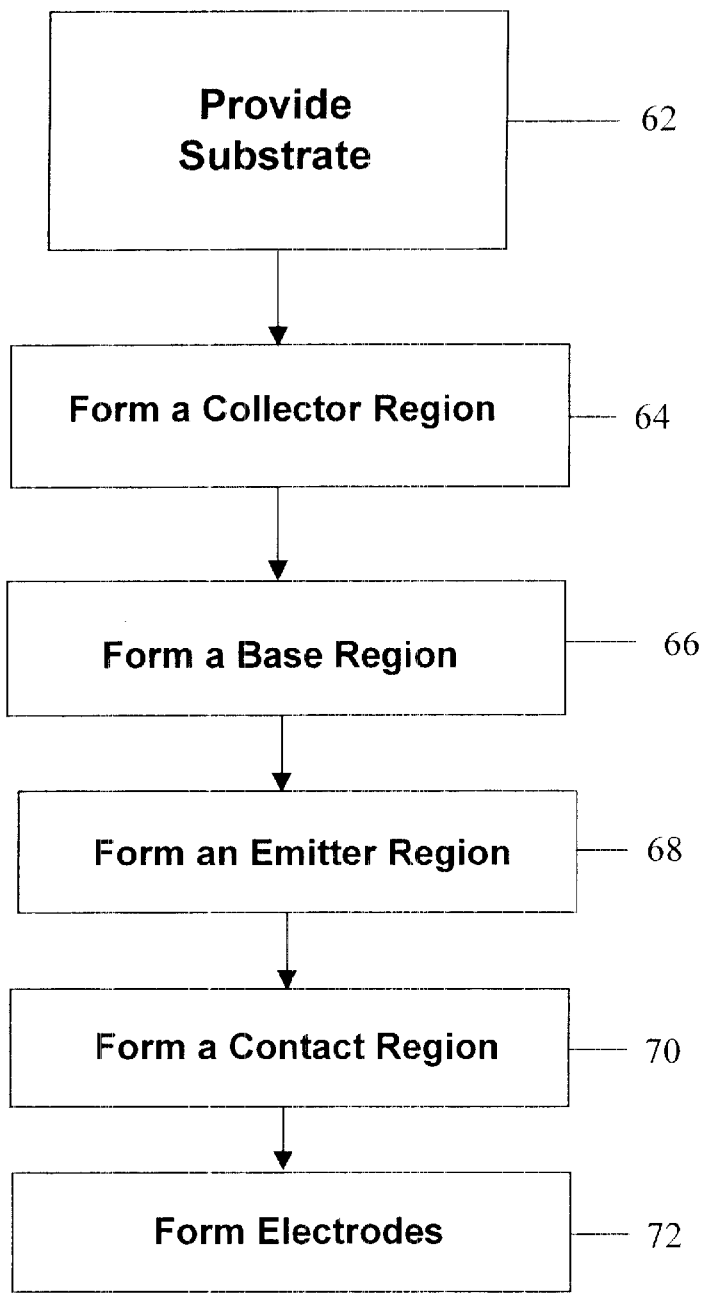
FIG. 3 is a block-fold diagram illustrating steps taking to fabricate one of the heterojunction bipolar transistors illustrated in FIGS. 1–2.

FIG. 3 illustrate the steps taken to form one of the illustrative compound semiconductor devices of the present invention. On a provided substrate (step 62) a collector region is formed having at least one layer to form a first stack (step 64). Suitable techniques for forming the collector region include metal organic chemical vapor deposition (MOCVD) or molecular beam epitaxy (MBE). Upon formation of the collective region, a base region is formed or grown over a portion of the collector region (step 66). The base region is formed to include at least one layer and forms a second stack. An emitter region is grown or formed over a portion of the base region to form a third stack (step 68). The emitter region is formed to have at least one layer. In similar fashion, a contact region is grown or formed over a portion of the emitter region to form a fourth stack (step 70). The contact region is formed to have at least one layer. The emitter electrode, the base electrodes, and the collector electrodes are formed by metal deposition and liftoff, self-aligned or non-self-aligned, using a material of Ti, Au, Ni, W, Ge, Pt. (step 72). Those skilled in the art will recognize that each of the stacks discussed above are capable of being formed by MOCVD or by MBE. Nonetheless, those skilled in the art will recognize that other fabrication methods may be suitable depending on feature sizes or other constraints such as material type.

Those skilled in art will appreciate that the applications of the various compound semiconductor devices described herein are not limited solely to high speed data manipulation, for example, the compound semiconductor devices of the present invention are well suited for operations portable or mobile electronic devices capable of communicating with a network in a wireless manner to increase or improve the bandwidth capacity of the network. One possible example for the compound semiconductor devices of the present invention is the use in a mobile telephone or "cellphone" capable of communicating with a satellite network, a terrestrial network or a hybrid network of terrestrial network entities and satellite network entities.

While the present invention has been described with reference to illustrative embodiments thereof, those skilled in the art will appreciate that various changes in form in detail may be made without parting from the intended scope of the present invention as defined in the appended claims.

What is claimed is:

1. A heterojunction bipolar transistor, comprising
   a substrate;
   a collector portion having at least one layer of a first material;
   a base portion having at least one layer of a second material;
   an emitter portion having at least one layer of said first material; and
   a contact portion having at least one layer of said first material and at least one layer of an $In_xGa_{1-x}(As_{1-y}Sb_y)$ (0<x<0.7) (0<y<0.5).

2. The heterojunction bipolar transistor of claim 1, wherein the substrate comprises, a semi-insulating material.

3. The heterojunction bipolar transistor of claim 2, wherein the semi-insulating material comprises, GaAs.

4. The heterojunction bipolar transistor of claim 1, wherein the first material comprises GaAs.

5. The heterojunction bipolar transistor of claim 1, wherein the second material comprises a $In_xGa_{1-x}(As_{1-y}Sb_y)$ ($0<x<0.7$) ($0<y<0.5$).

6. The heterojunction bipolar transistor of claim 1, wherein the collector comprises a second layer of said first material to form a sub-collector, the sub-collector having a portion of a first surface in contact with a portion of a first surface of said substrate.

7. The heterojunction bipolar transistor of claim 1, wherein the $In_xGa_{1-x}(As_{1-y}Sb_y)$ ($0<x<0.7$) ($0<y<0.5$) material of the contact is doped to form an n type contact layer.

8. The heterojunction bipolar transistor of claim 6, wherein the sub-collector has a thickness of between about 500 nm and about 1,500 nm.

9. The heterojunction bipolar transistor of claim 6, wherein the sub-collector has a thickness of about 500 nm.

10. The heterojunction bipolar transistor of claim 1, wherein the at least one layer of the first material of the collector portion of the heterojunction bipolar transistor has a thickness of between about 100 nm and about 2,000 nm.

11. The heterojunction bipolar transistor of claim 1, wherein the at least one layer of the first material of the collector portion of the heterojunction bipolar transistor has a thickness of about 300 nm.

12. The heterojunction bipolar transistor of claim 1, wherein the base portion of the heterojunction bipolar transistor has a thickness of between about 0 nm and about 40 nm.

13. The heterojunction bipolar transistor of claim 1, wherein the emitter portion of the heterojunction bipolar transistor has a thickness of between about 50 nm and about 300 nm.

14. The heterojunction bipolar transistor of claim 1, wherein the emitter portion of the heterojunction bipolar transistor has a thickness of about 50 nm.

15. The heterojunction bipolar transistor of claim 1, wherein the at least one layer of the first material of the contact portion of the heterojunction bipolar transistor has a thickness of about 100 nm.

16. The heterojunction bipolar transistor of claim 1, wherein the at least one layer of the first material of the contact portion of the heterojunction bipolar transistor has a thickness of between about 50 nm and about 300 nm.

17. The heterojunction bipolar transistor of claim 1, wherein the at least one layer of the $In_xGa_{1-x}(As_{1-y}Sb_y)$ ($0<x<0.7$) ($0<y<0.5$) material of the contact portion of the heterojunction bipolar transistor has a thickness of between about 30 nm and about 150 nm.

18. A heterojunction bipolar transistor, comprising
  a substrate;
  a collector portion having at least one layer of a first material;
  a base portion having at least one layer of a second material;
  an emitter portion having at least one layer of a third material; and
  a contact having at least one layer of said first material and at least one layer of a $In_xGa_{1-x}(As_{1-y}Sb_y)$ ($0<x<0.7$) ($0<y<0.5$) material.

19. The heterojunction bipolar transistor of claim 18, wherein the substrate comprises a semi-insulating material.

20. The heterojunction bipolar transistor of claim 19, wherein the semi-insulating material comprises GaAs.

21. The heterojunction bipolar transistor of claim 18, wherein the first material comprises GaAs.

22. The heterojunction bipolar transistor of claim 18, wherein the second material comprises a $In_xGa_{1-x}(As_{1-y}Sb_y)$ ($0<x<0.7$) ($0<y<0.5$) material.

23. The heterojunction bipolar transistor of claim 18, wherein the third material comprises a $In_{0.51}Ga_{0.49}P$ material.

24. The heterojunction bipolar transistor of claim 18, wherein the collector comprises a second layer of said first material to form a sub-collector having a portion of a first surface in contact with a portion of a first surface of said substrate.

25. The heterojunction bipolar transistor of claim 22, wherein the sub-collector has a thickness of about 500 nm.

26. The heterojunction bipolar transistor of claim 22, wherein the sub-collector has a thickness of between about 500 nm and 1,500 nm.

27. The heterojunction bipolar transistor of claim 18, wherein the at least one layer of the first material of the collector portion of the heterojunction bipolar transistor has a thickness of about 300 nm.

28. The heterojunction bipolar transistor of claim 18, wherein the at least one layer of the first material of the collector portion of the heterojunction bipolar transistor has a thickness of between about 100 nm and 2,000 nm.

29. The heterojunction bipolar transistor of claim 18, wherein the base portion of the heterojunction bipolar transistor has a thickness of between about 0 nm and about 40 nm.

30. The heterojunction bipolar transistor of claim 18, wherein the emitter portion of the heterojunction bipolar transistor has a thickness of about 50 nm.

31. The heterojunction bipolar transistor of claim 18, wherein the emitter portion of the heterojunction bipolar transistor has a thickness of between about 50 nm and 300 nm.

32. The heterojunction bipolar transistor of claim 18, wherein the at least one layer of the first material of the contact portion of the heterojunction bipolar transistor has a thickness of about 100 nm.

33. The heterojunction bipolar transistor of claim 18, wherein the at least one layer of the first material of the contact portion of the heterojunction bipolar transistor has a thickness of between about 50 nm and 300 nm.

34. The heterojunction bipolar transistor of claim 18, wherein the at least one layer of the $In_xGa_{1-x}(As_{1-y}Sb_y)$ ($0<x<0.7$) ($0<y<0.5$) material of the contact portion of the heterojunction bipolar transistor has a thickness of between about 30 nm and about 150 nm.

35. A method for forming a compound semiconductor device, the method comprising the steps of:
  forming a collector stack having at least one layer of a first material on a substrate;
  forming a base stack having at least one layer of a second material on a portion of the collector stack;
  forming an emitter stack having at least one layer of said first material on a portion of the base stack; and
  forming a contact stack on a portion of the emitter stack, the contact stack having at least one layer of said first material and at least one layer of an $In_xGa_{1-x}(As_{1-y}Sb_y)$ ($0<x<0.7$) ($0<y<0.5$) material.

36. The method of claim 27, further comprising the step of forming a sub-collector in said collector stack, the sub-collector having a portion of first surface in contact with a portion of a first surface of said substrate.

37. The method of claim 27, wherein the substrate comprises a semi-insulating material.

38. The method of claim 27, wherein the first material comprises, GaAs.

39. The method of claim 27, wherein the second material comprises a $In_xGa_{1-x}(As_{1-y}Sb_y)$ (0<x<0.7) (0<y<0.5) material.

40. A method for forming a compound semiconductor device, the method comprising the steps of:

forming a collector stack having at least one layer of a first material on a substrate;

forming a base stack having at least one layer of a second material on a portion of the collector stack;

forming an emitter stack having at least one layer of a third material on a portion of the base stack; and forming a contact stack on a portion of the emitter stack, the contact stack having at least one layer of said first material and at least one layer of an $In_xGa_{1-x}(As_{1-y}Sb_y)$ (0<x<0.7) (0<y<0.5) material.

41. The method of claim 36, further comprising the step of forming a sub-collector in said collector stack, the sub-collector having a portion of a first surface in contact with a portion of a first surface of said substrate.

42. The method of claim 36, wherein the substrate comprises a semi-insulating material.

43. The method of claim 36, wherein the first material comprises GaAs.

44. The method of claim 36, wherein the second material comprises a $In_xGa_{1-x}(As_{1-y}Sb_y)$ (0<x<0.7) (0<y<0.5) $n_xGa_{1-x}As_{0.5}P_{0.5}$ (0<x<0.20) material.

45. The method of claim 36, wherein the third material comprises, an $Al_xGa_{1-x}As$ (0<x<0.5) material.

* * * * *